(12) United States Patent
Nakamura et al.

(10) Patent No.: US 6,605,844 B2
(45) Date of Patent: Aug. 12, 2003

(54) SEMICONDUCTOR DEVICE (75) Inventors: Kazutoshi Nakamura, Yokohama (JP); Yusuke Kawaguchi, Hayama-machi (JP); Akio Nakagawa, Fujisawa (JP)

(73) Assignee: Kabushiki Kaisha Toshiba, Tokyo-To (JP)

(*) Notice: Subject to any disclaimer, the term of this patent is extended or adjusted under 35 U.S.C. 154(b) by 0 days.

(21) Appl. No.: 09/949,611

(22) Filed: Sep. 12, 2001

(65) Prior Publication Data
US 2002/0030238 A1 Mar. 14, 2002

(30) Foreign Application Priority Data

Sep. 11, 2000 (JP) .......................... 2000-274434

(51) Int. Cl.[7] .......................... H01L 23/62; H01L 29/76
(52) U.S. Cl. .................. 257/360; 257/328; 257/361; 257/378; 257/355; 257/368
(58) Field of Search .................. 257/335, 339, 257/342, 343, 360, 361, 328, 350, 378, 355, 409

(56) References Cited

U.S. PATENT DOCUMENTS

| | | |
|---|---|---|
| 4,881,120 A | 11/1989 | Nakagawa et al. |
| 4,928,155 A | 5/1990 | Nakagawa et al. |
| 5,068,700 A | 11/1991 | Yamaguchi et al. |
| 5,157,573 A * | 10/1992 | Lee et al. .................. 361/111 |
| 5,517,046 A * | 5/1996 | Hsing et al. .................. 257/336 |
| 5,701,023 A * | 12/1997 | Bulucea et al. .............. 257/139 |
| 6,064,086 A | 5/2000 | Nakagawa et al. |
| 6,133,607 A | 10/2000 | Funaki et al. |
| 6,137,140 A | 10/2000 | Efland et al. |
| 6,144,070 A * | 11/2000 | Devore et al. .............. 257/343 |

OTHER PUBLICATIONS

S. Pendharkar, et al., ISPSD '2000, pp. 341–344, "SCR–LD-MOS—A Novel LDMOS Device with ESD Robustness", May 22–25, 2000.

* cited by examiner

*Primary Examiner*—Eddie Lee
*Assistant Examiner*—Matthew C Landau
(74) *Attorney, Agent, or Firm*—Oblon, Spivak, McClelland, Maier & Neustadt, P.C.

(57) ABSTRACT

A semiconductor device includes an active layer of a first conductive type. A base layer of a second conductive type is selectively formed on a surface region of said active layer. A source layer of the first conductive type is selectively formed on a surface region of the base layer. An anode layer of the second conductive type is selectively formed on a surface region of the active layer, the anode layer being spaced from the base layer. A drain layer of the first conductive type is formed on a surface region between the base layer and the anode layer. A resistive layer of the first conductive type is formed on a surface region between the base layer and the drain layer. And, a gate electrode is formed above a region of the base layer between the source layer and the active layer, a gate insulating film being disposed between the base layer and the gate electrode. A source electrode is formed on the surface of the base layer and the source layer, while a drain electrode is formed on the surface of the drain layer and the anode layer.

5 Claims, 6 Drawing Sheets

SEMICONDUCTOR DEVICE

CROSS REFERENCE TO THE RELATED APPLICATION

This application is based upon and claims the benefit of priority from the prior Japanese Patent Application No. 2000-274434, filed on Sept. 11, 2000; the entire contents of which are incorporated herein by reference.

BACKGROUND OF THE INVENTION

The present invention relates to a semiconductor device and a high breakdown voltage device and especially to the protection against electro-static discharge (ESD) on a Lateral Double Diffusion MOSFET (LDMOS).

In general, power IC devices are realized by a low-voltage device and a high breakdown voltage device and they are widely used in the automobile industries or the like. A vehicle-mounted semiconductor device is operated under hostile environments. It is hence necessary to protect the semiconductor device for this purpose in a relatively high level against electric transient phenomena such as electro-static discharge (ESD).

The ESD is considered to be a high-energy pulse which is generated when a person or a material charged comes in contact with the IC device. As one of possible methods of protecting the semiconductor device from ESD, such a configuration is considered that a resistor element is inserted between a semiconductor element and an output terminal (pin) to lower a high voltage level. However, a LDMOS, which is a high breakdown voltage device, is desired to have both a lower level of ON resistance and a high level of breakdown voltage. Accordingly, when the resistor element is provided, the characteristic of the ON resistance of the LDMOS based on pads will adversely be affected, when viewed from a pad.

Figure 11:
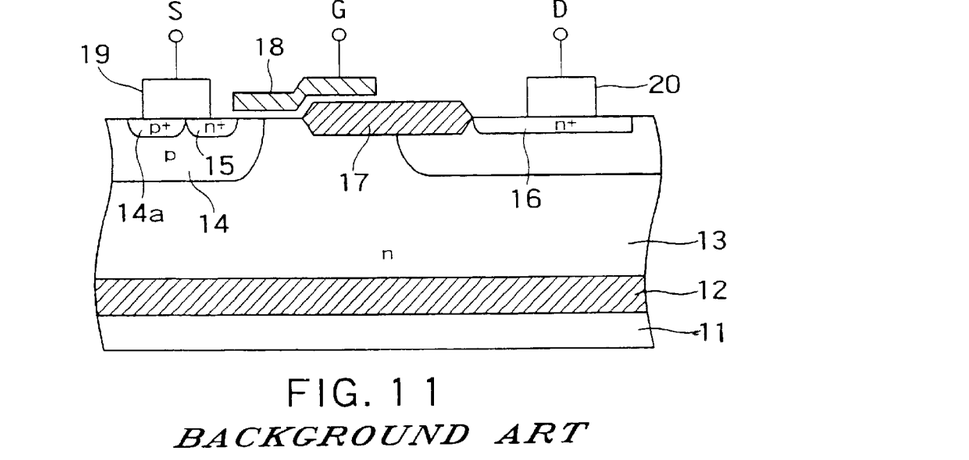
FIG. 11 is a cross sectional view of a conventional LDMOS device.

FIG. 11 illustrates a convention n-type LDMOS formed on a silicon on insulator (SOI) substrate. The SOI substrate comprises a silicon base substrate 11, an n-type silicon layer 13, and an $SiO_2$ layer 12 interposed between the base substrate 11 and the layer 13. Provided selectively in the active layer 13 is a p-type base layer 14. The p-type base layer 14 contains an $n^+$-type source layer 15 and a $p^+$-type diffusion layer 14a. An $n^+$-type drain layer 16 is formed at a portion of the active layer 13 which is spaced from the base layer 14. A LOCOS oxide film 17 is formed in a surface region of the active layer 13 between the drain layer 16 and the base layer 14. A gate electrode (G) 18 is formed above the active layer 13 and the base layer 14 positioned between the source layer 15 and the LOCOS oxide film 17 as separated from the SOI substrate via a gate oxide layer (not shown). A source electrode (S) 19 is formed above the source layer 15 and the $p^+$-type diffusion layer 14a while a drain electrode (D) 20 is formed above the drain layer 16.

When a high intensity of electric field is applied on the drain layer 16 by ESD, an avalanche breakdown occurs at an edge of the drain layer 16 on the side of the LOCOS oxide film 17, thereby generating electrons and holes. The electrons generated at the edge of the drain layer 16 flow into the drain layer 16 while the hole current flows into the base layer 14. If this hole current exceeds a predetermined value, a parasitic bipolar transistor composed of the n-type drain layer 16, the p-type base layer 14, and the n-type source layer turns on. As the parasitic bipolar transistor turns on, the voltage between the source layer and the drain layer is clamped to a low voltage level. However, at the edge of the drain layer, current is locally intensified and a thermal runaway will occur. As a result, the drain layer is declined in the resistance to ESD and may finally be destructed.

SUMMARY OF THE INVENTION

A semiconductor device according to an embodiment of the present invention comprises:

an active layer of a first conductive type;

a base layer of a second conductive type selectively formed on a surface region of said active layer;

a source layer of the first conductive type selectively formed on a surface region of said base layer;

an anode layer of the second conductive type selectively formed on a surface region of the active layer, said anode layer being spaced from said base layer;

a drain layer of the first conductive type formed on a surface region between said base layer and said anode layer;

a resistive layer of the first conductive type formed on a surface region between said base layer and said drain layer; and a gate electrode formed above a region of said base layer between said source layer and said active layer, a gate insulating film being disposed between said base layer and said gate electrode, wherein a source electrode is formed on the surface of the base layer and the source layer while a drain electrode is formed on the surface of the drain layer and the anode layer.

A semiconductor device according to another embodiment of the present invention comprises:

a first device of lateral DMOS type including a first active layer of the first conductive type, a first base layer of the second conductive type formed in said first active layer, a first source layer of a first conductive type formed in said first base layer, an anode layer of a second conductive type formed in said first active layer so as to be spaced from the first source layer, a first drain layer of the first conductive type provided next to said anode layer, a resistive layer of the first conductive type provided next to said drain layer, and a first gate layer formed above a region between said first source layer and said resistive layer via a gate insulating film;

a second device of lateral DMOS type including a second base layer of the second conductive type formed in said first active layer, a second source layer of the first conductive type formed in the second base layer, a second drain layer of the first conductive type formed in a second active layer so as to be spaced from the second source layer, and a second gate layer formed above a region of the second base layer between the second source layer and the second drain layer as separated by a gate insulating film;

a source electrode for electrically connecting between the first source layer and the second source layer;

a drain electrode for electrically connecting between the first drain and drain layers and the second drain layer; and a gate electrode for electrically connecting between the first gate layer and the second gate layer.

DETAILED DESCRIPTION OF THE INVENTION

The embodiments of the present invention will be described with reference to the accompanying drawings.

Figure 1:
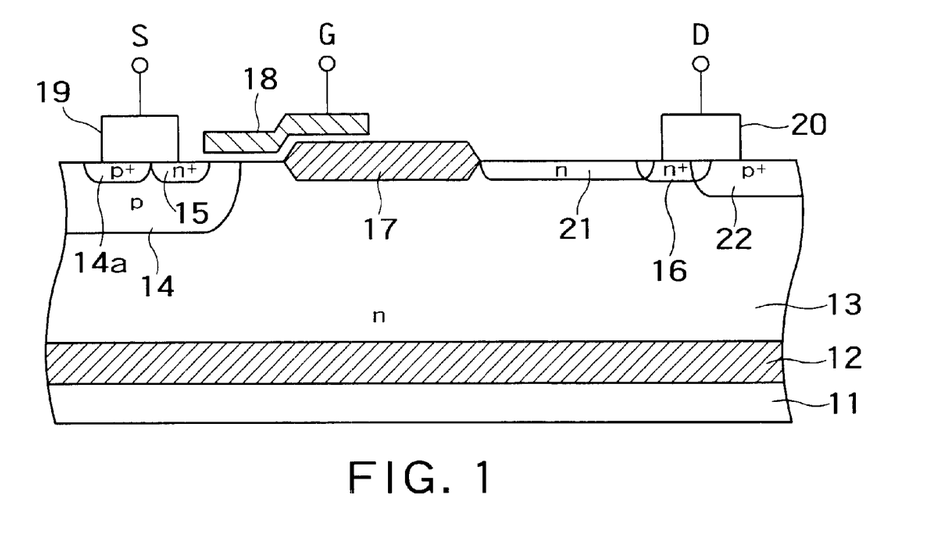
FIG. 1 is a cross sectional view of a semiconductor device according to a first embodiment of the present invention.

FIG. 1 illustrates an LDMOS device according to the first embodiment of the present invention. The device shown in FIG. 1 is an n-type LDMOS formed on a SOI (silicon on insulator) substrate. The SOI substrate comprises a silicon base substrate 11, an active (n-type silicon) layer 13, and an embedded oxide layer 12 ($SiO_2$) embedded between the silicon base substrate and the active substrate. P-type base layers 14 are formed selectively in the active layer 13. The base layer 14 contains an $n^+$-type layer 15 and $p^+$-type diffusion layer 14a developed selectively. A $p^+$-type anode layer 22 is also formed in the active layer 13 which is spaced from the base layer 14. A LOCOS oxide film 17 is formed in a surface region of the active layer 13 that is positioned between the anode layer 22 and the base layer 14. An $n^+$-type drain layer 16 is formed next to the anode layer 22 between the LOCOS oxide film 17 and the anode layer 22 in the active layer 13. An n-type resistive layer 21 is formed in the active layer 13 between the LOCOS oxide film 17 and the $n^+$-type drain layer 16.

The $p^+$-type anode layer 22 conducts no action within a range of the rated voltages in the LDMOS, but feeds holes to the active layer 13 at the time of ESD.

A gate electrode (G) 18 is formed above the active layer 13 and the base layer 14 between the source layer 15 and the LOCOS oxide film 17 as separated from the SOI substrate through a gate oxide layer not shown. The source layer 15 and the diffusion layer 14a are connected to a source electrode (S) 19 which may be made of aluminum (1Al) serving as the first layer. Similarly, the drain layer 16 and the anode layer 21 are connected to a drain electrode (D) 20 which is, for example, made of aluminum (1Al) serving as the first layer.

Within the rated voltage range, no holes are received from the anode layer 22. Accordingly, as the device performs a common LDMOS action, electrons run from the source layer to the drain layer. During the action at the rated voltage, the anode 22 provides no action.

When the drain electrode 20 is loaded with a voltage higher than the rated voltage level by the effect of ESD, a depletion layer expands from the p-type base layer 14 causing the electric field to be intensified at the edge of the n-type resistive layer 21. As a result, an avalanche breakdown occurs thus generating electrons and holes. The electrons flow across the n-type resistive layer 21 to the drain layer 16. The holes generated by the avalanche breakdown run into the p-type base layer 14. If this hole current becomes a predetermined value, an activate a parasitic npn transistor composed of the n-type source layer 15, the p-type base layer 14, and the n-type active layer 13 turns on.

Figure 2:
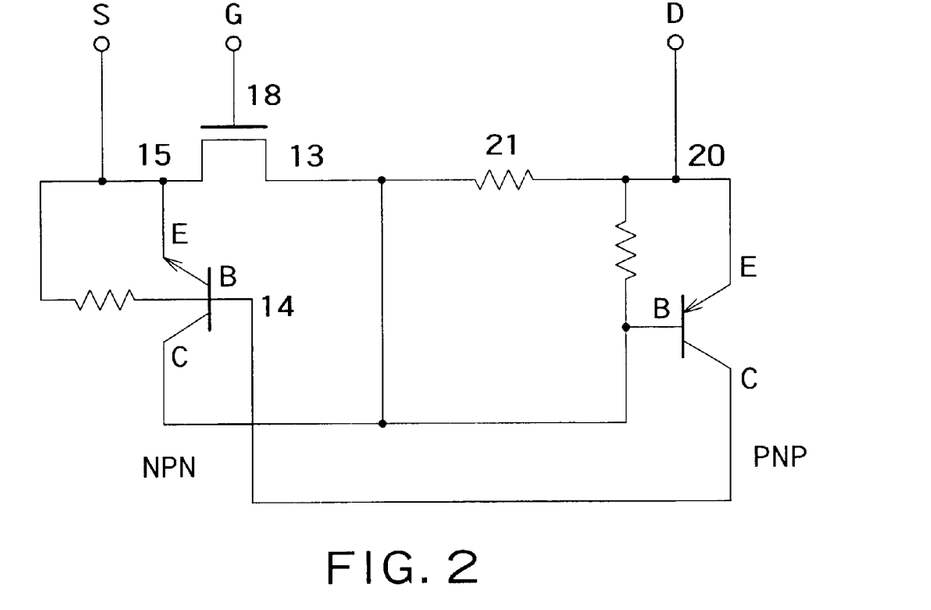
FIG. 2 is an equivalent circuit diagram of the semiconductor device shown in FIG. 1.

FIG. 2 illustrates an equivalent circuit of the device shown in FIG. 1.

As apparent from FIG. 2, as the element configuration shown in FIG. 1, a thyristor is formed by a connection between an npn transistors and a pnp transistor connected at their base and collector respectively to each other.

In the circuit, when the product of a resistance R connected to the base of the npn transistor and a base current Ib is greater than the threshold, e.g. 0.7 V, of the transistor, the npn transistor is turned on thus switching the thyristor on to start an action of protecting against ESD.

Figure 3:
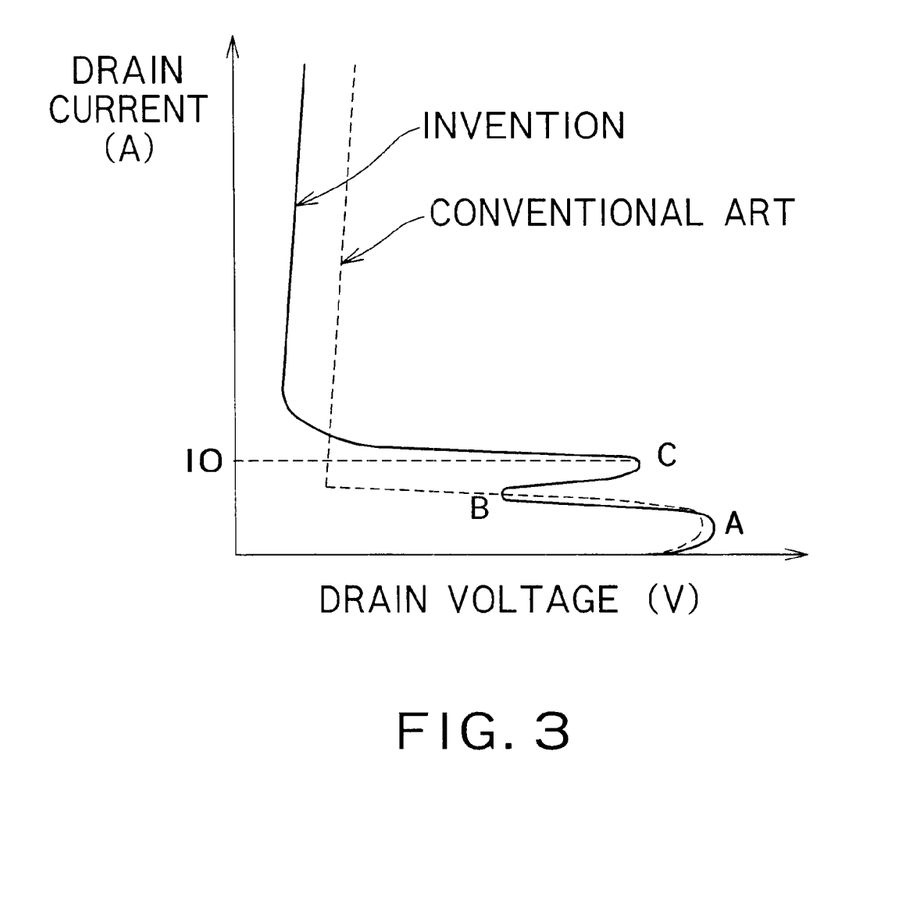
FIG. 3 is a characteristic diagram showing an operation at the time of ESD in the device shown in FIG. 1.
Figure 4:
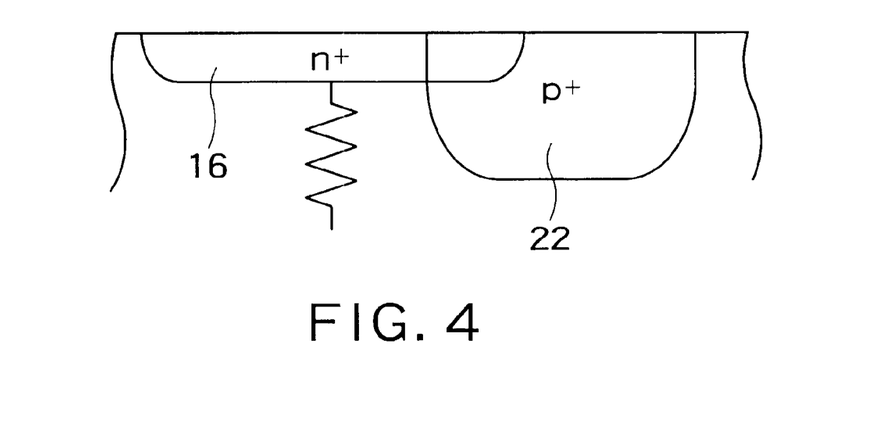
FIG. 4 is an enlarged view showing a region adjacent to the drain layer in the device shown in FIG. 1.

FIG. 3 illustrates the relationship between the drain voltage and the drain current. When the parasitic npn transistor is turned on, the drain voltage is clamped to a lower level B, as shown in FIG. 3. A large flow of electron current is passed through the n-type resistive layer 21 and received by the n-type drain layer 16. At the time, as the electric energy is intensified at the edge of the n-type resistive layer 21, as the voltage at the edge of the n-type resistive layer 21 declines, current runs through the n-type resistive layer 21, hence attenuating the electric field along the direction of channel length. The greater the current that runs into the resistive layer 21, the more the voltage drops down. As a result, a negative feedback is established in the direction for attenuating the electric field. This phenomenon is illustrated by a curve from B to C in FIG. 3. When the current exceeds a specific level, it rushes down through the n-type resistive layer 21 and flows into the $n^+$-type drain layer 16. This causes the current to become intensified just beneath the $n^-$-type drain layer 16. As the current is intensively forced through the resistance shown in FIG. 4, the built-in potential between the p-type anode 22 and the n-type active layer 13 is forward biased to receive the holes from the anode layer 22. At the time, the parasitic thyristor is turned on, thus clamping the voltage to a lower level. It is essential for forward biasing that the built-in potential between the p-type anode 22 and the n-type active layer 13 has the resistance shown in FIG. 4, as the junction depth of the p-type anode 22 is greater than that of the $n^+$-type drain layer 16.

In a conventional DMOS device, a parasitic bipolar transistor (of npn-type) is activated at the time of ESD to run a flow of electrons between the source and the drain hence clamping the voltage between the same to a particular level. On the other hand, the present invention allows the LDMOS parasitic thyristor to be activated to run a flow of current due to the holes and the electrons between the source layer 15 and the drain layer 16. Accordingly, the clamping voltage will be smaller than that of the conventional LDMOS device denoted by the dotted line in FIG. 3.

Also, as the holes are migrated from the p-type anode layer 22 to the active layer 13, the electrical conductivity adjacent to the drain layer 16 is declined thus permitting a current of electrons to be not concentrated at the edge of the drain layer 16 but moved through a wider region. This can prevent any thermal runaway at the edge of the drain layer 16 hence ensuring no destruction of the transistor.

The current level 10 shown in FIG. 3 may be varied depending on the dose of impurities in and the length of the resistive layer. The greater the resistance in the resistive layer, the more the negative feedback can be involved and, subsequently the current level 10 can be declined. The dose in the resistive layer has to be determined so that the positive charge is not offset by a high current running through the resistive layer. The n-type resistive layer 21 may be developed by implanting e.g. phosphorous ions into the active layer 13. Preferably, the dose of phosphorous ions is substantially not smaller than $1 \times 10^{14}/cm^2$. The diffusion layer employed for LDD may be preferable in a CMOS or BiCMOS process.

Figure 5:
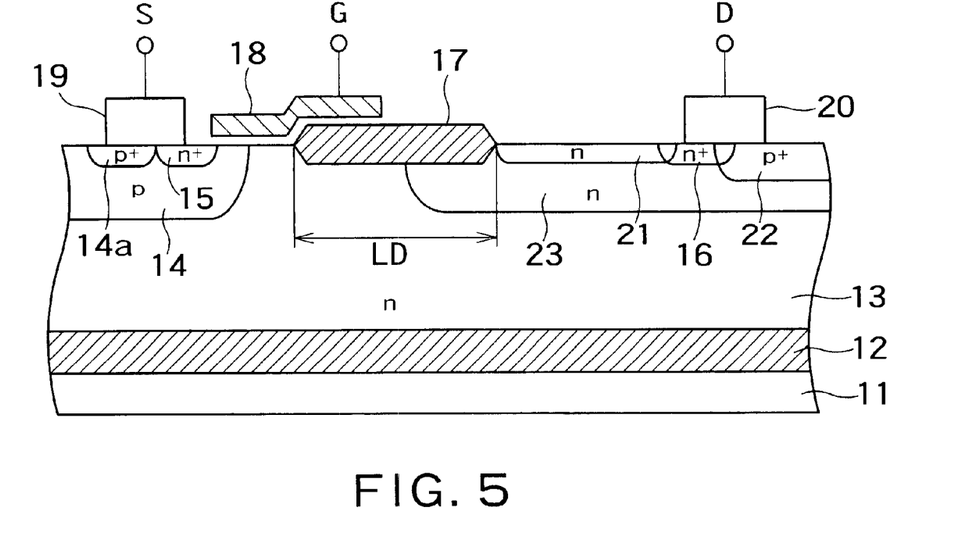
FIG. 5 is a cross sectional view of a semiconductor device according to a second embodiment of the present invention.

FIG. 5 is a cross sectional view of a semiconductor device according to the second embodiment of the present invention. An n-type offset layer 23 is provided to a shape surrounding an n-type resistive layer 21, an n⁺-type drain layer 16, and a p-type anode layer 22. The offset layer 23 inhibits a depletion layer extending from the SOI substrate from reaching the p-type anode layer 22. If the depletion layer reaches the p-type anode layer 22, a punch-through may occur between the anode layer 22 and the base layer 14. Also, the offset layer 23 can decline the resistance of a drift region and raise the breakdown voltage at the ON state. The n-type offset layer 23 may be developed by implanting e.g. phosphorous ions into the active layer 13. The net dose of phosphorous ions is preferably within a range from $3 \times 10^{12}$ to $4 \times 10^{12}/cm^2$. It is also necessary that the relationship in concentration between the active layer 13, the offset layer 23, and the n-type resistive layer are expressed by:

$$n13 < n23 < n21$$

Figure 6:
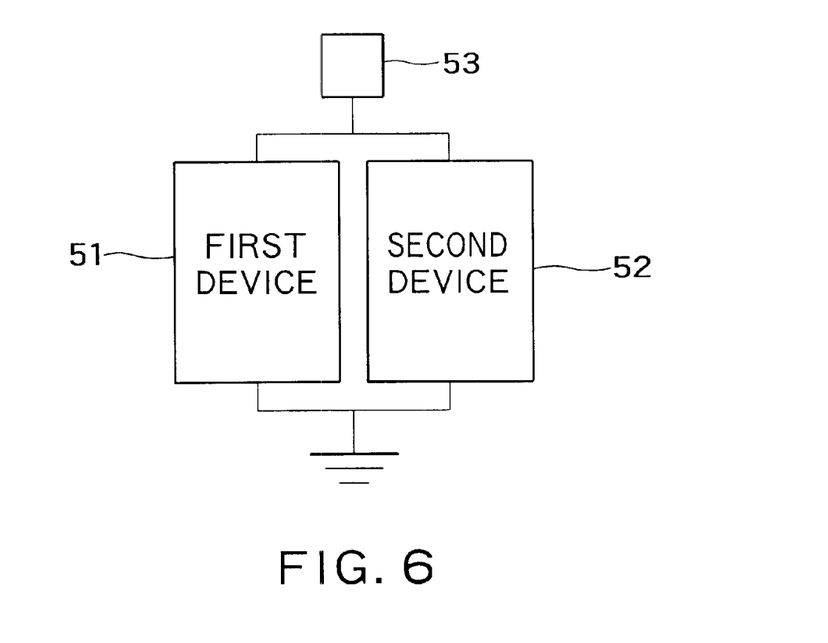
FIG. 6 is a conceptual diagram of a semiconductor device according to the third embodiment of the present invention.

FIG. 6 is a schematic diagram of a semiconductor device according to the third embodiment of the present invention. This embodiment features a first LDMOS device including a p-type anode layer 22 and a second device 52 of the conventional LDMOS type excluding an n-type resistive layer 21 joined in parallel with each other and connected to a pad 53. It is also desired to have the first device 51 set smaller in the static breakdown voltage (with the gate voltage at 0V) than the second device 52.

According to the arrangement, the first device 51 acts faster than the second device 52 at the time of ESD. This can prevent the second device 52 from being destructed. This reduces the static breakdown voltage, making the drift length LD of the LDMOS device having the p-type anode layer 22 shorter than that of an LDMOS device without the p-type anode layer 22, as shown in FIG. 5.

Moreover, the installation area of the two devices may be smaller than that of the first embodiment.

Figure 7:
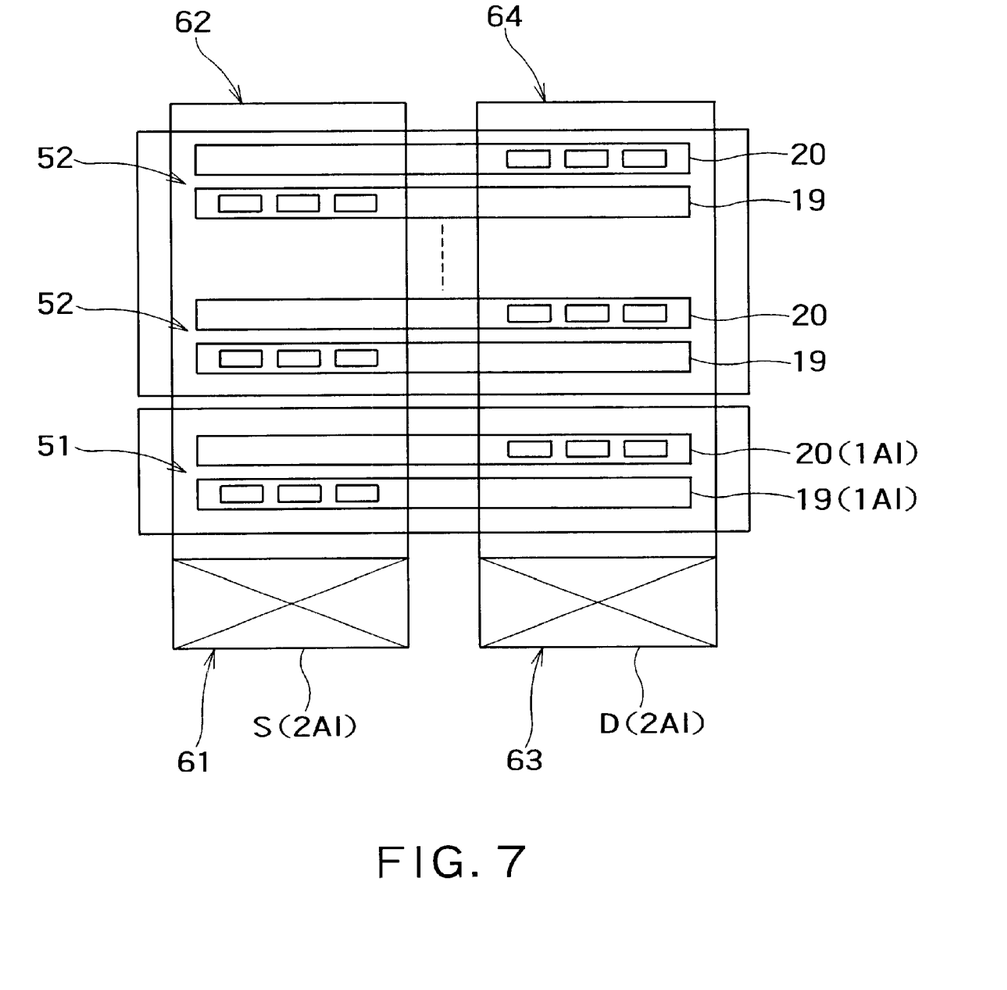
FIG. 7 is a plan view of a semiconductor device according to a fourth embodiment of the present invention.

FIG. 7 is a plan view of a semiconductor device according to the fourth embodiment of the present invention. This embodiment is a modification of the third embodiment where like components are denoted by like numerals as those shown in FIG. 6. This embodiment features in that a first device 51 including the p⁺-type anode layer 22 connected to two or more second devices 52, excluding the p⁺-type anode layer 22. In the arrangement of the devices, the first device 51, which has high resistance to ESD, is located adjacent to pads. More particularly, a pad 61 for connection to the source layer S is joined to a source line 62, which is made of aluminum (2Al), serving as the second layer. Another pad 63, for connection to the drain layer D, is joined to a drain line 64, which is made of aluminum (2Al), serving as the second layer. The first device 51 is located close to the pads 61 and 63. The first device 51 and the second device 52 are connected at their source electrode 13 to the source line 62, and at their drain electrode 21 to the drain line 64.

According to the fourth embodiment, as the first device 51 which is high in the resistance to ESD is located close to the pads, the second devices 52 can certainly be protected from the effect of ESD.

In case that the LDMOS device has a p⁺-type anode layer 22, the length of the device along the direction of channel length is increased, and it causes an expansion of the element area. The LDMOS device region having the p⁺-type anode layer 22 is determined to a size enough to provide a degree of the resistance to ESD while the remaining region stays as common LDMOS. This can improve the resistance of the LDMOS to ESD without sacrificing the element area.

While the arrangement of layout with a two-layer structure explained, it may be implemented by a three or more layer construction. Although aluminum is mentioned in the second layer in the arrangement, it may be fabricated by any other applicable metallic material.

The embodiments of the present invention are not limited to a combination of the first conductor of n-type and the second conductor of p-type that is described, they may be implemented with equal success by another combination, such as the first conductor of p-type and the second conductor of n-type. Also, various changes and modifications are possible without departing from the scope of the present invention.

Figure 8:
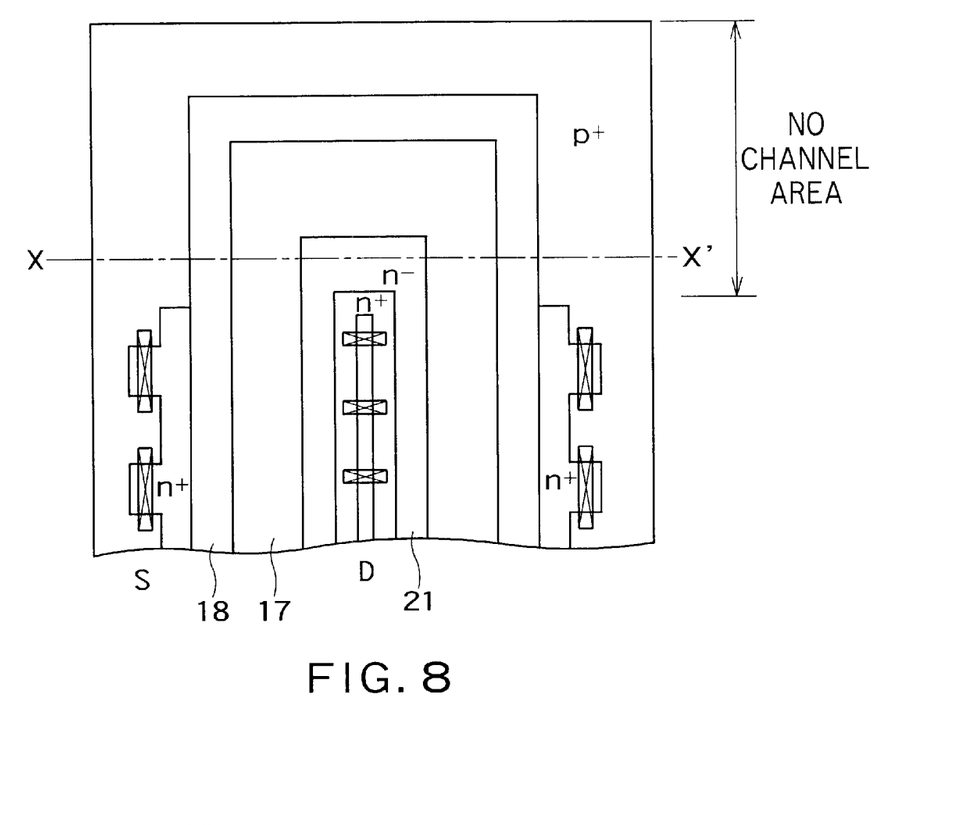
FIG. 8 is a plan view of a semiconductor device according to a fifth embodiment of the present invention.
Figure 9:
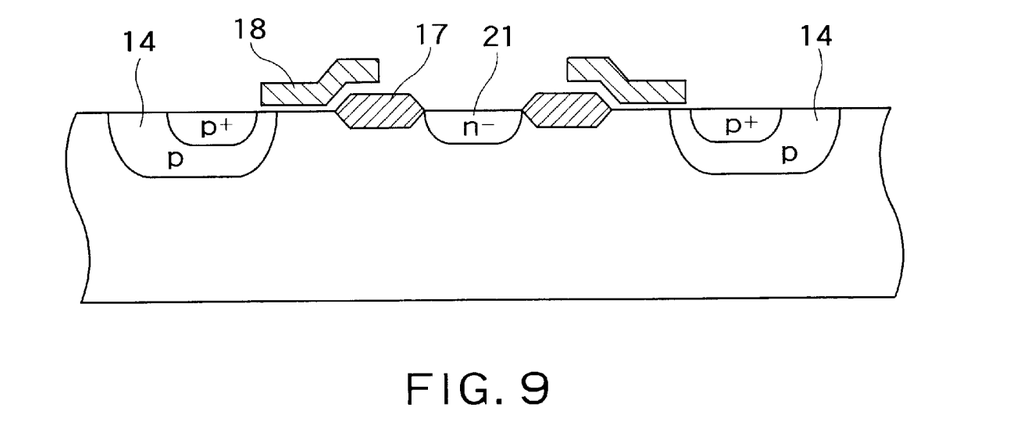
FIG. 9 is a cross sectional view taken along the line X–X' of FIG. 8.

FIG. 8 is a plan view showing the fifth embodiment of the present invention and FIG. 9 is a cross sectional view taken along the line X–X' of FIG. 8, where line components are denoted by like numerals as those explained in the previous embodiments.

In this embodiment, the channel locations are determined so as not to develop channels in an electric field intensive area or an area where the thyristor composed of parasitic transistors is possibly switched on. This inhibits the development of parasitic npn transistors hence allowing the current to be hardly intensified locally at the edge of the drain layer and producing no thermal runaway in the region. As a result, a protection for broad area of the semiconductor device can be uniformly made.

Figure 10:
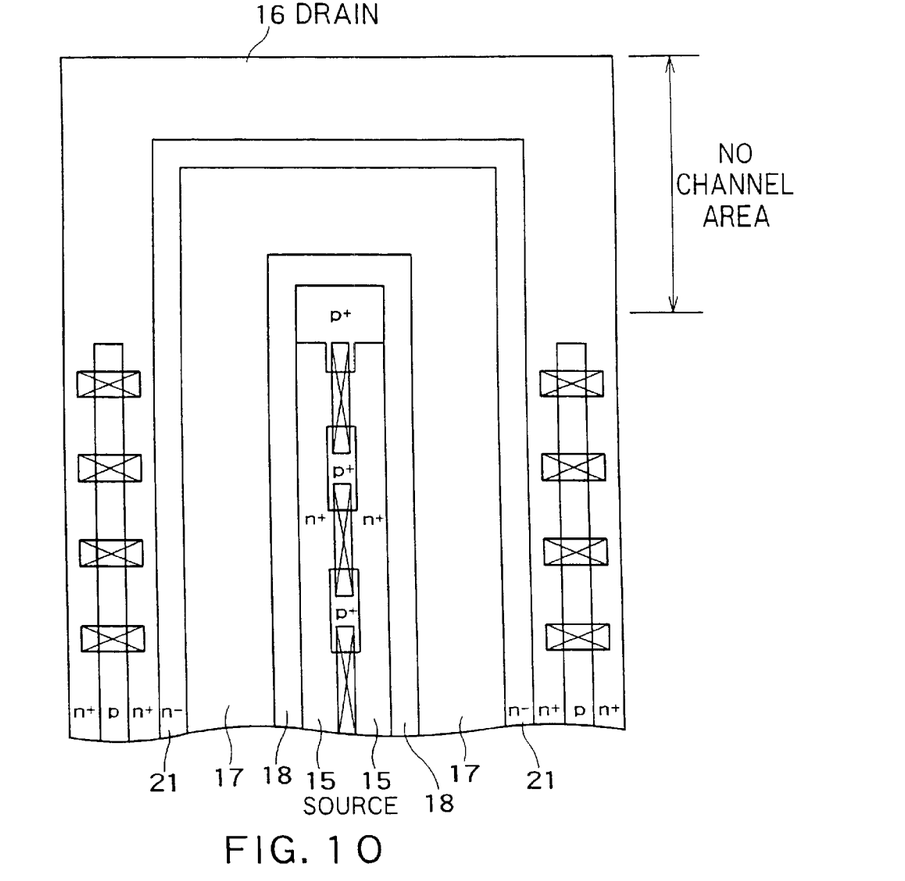
FIG. 10 is a plan view of a variation of the semiconductor device shown in FIG. 8.

In the embodiment shown in FIG. 8, the source region is disposed in outer area. However, as shown in FIG. 10, the present invention may be applied to a semiconductor device in which a drain region is disposed in the outer area. In the construction shown in FIG. 10, the regions are formed so as not to develop a thyristor in the electric field intensive area.

As described above, the present invention can ease the intensity of current at the edge of the drain layer at the time of ESD and successfully lower the holding voltage at large current as compared with a convention LDMOS device, thus a semiconductor device that enables improvements on the resistance to ESD is provided.

What is claimed is:

1. A semiconductor device comprising:
   an active layer of a first conductive type;
   a base layer of a second conductive type selectively formed on a first surface region of said active layer;
   a source layer of the first conductive type selectively formed on a surface region of said base layer;
   an anode layer of the second conductive type selectively formed on a second surface region of the active layer, said anode layer being spaced from said base layer;
   a drain layer of the first conductive type formed on a third surface region of the active layer between said base layer and said anode layer;
   a resistive layer of the first conductive type formed on a fourth surface region of the active layer between said base layer and said drain layer; and
   a gate electrode formed above a region of said base layer between said source layer and said active layer, a gate insulating film being disposed between said base layer and said gate electrode, wherein
   a source electrode is formed on a surface of the base layer and a surface of the source layer, and a drain electrode is formed on a surface of the drain layer and a surface of the anode layer; and a junction depth of said anode layer is greater than a junction depth of said drain layer.

2. A semiconductor device according to claim 1, wherein a dose of impurities in said resistive layer is smaller than a dose of impurities in said drain layer.

3. A semiconductor device according to claim 1, wherein an offset layer of the first conductive type is formed so as to surround the anode layer.

4. A semiconductor device according to claim 1, wherein a diffusion layer of the second conductive type is formed next to said source layer in a surface region of said base layer.

5. A semiconductor device according to claim 1, wherein no channel area exists in a region in a horizontal direction with respect to said active layer where one of current and electric field can easily be intensified.

* * * * *